(12) United States Patent
Cheah et al.

(10) Patent No.: US 6,864,746 B2
(45) Date of Patent: Mar. 8, 2005

(54) DUAL GAIN AMPLIFICATION LOW NOISE AMPLIFIER

(75) Inventors: Jonathon Cheah, San Diego, CA (US); Eng Chuan Low, San Diego, CA (US)

(73) Assignee: Microtune (Texas), L.P., Plano, TX (US)

( * ) Notice: Subject to any disclaimer, the term of this patent is extended or adjusted under 35 U.S.C. 154(b) by 0 days.

(21) Appl. No.: 10/346,918

(22) Filed: Jan. 17, 2003

(65) Prior Publication Data

US 2003/0197560 A1 Oct. 23, 2003

Related U.S. Application Data

(60) Provisional application No. 60/350,417, filed on Jan. 18, 2002.

(51) Int. Cl.[7] ................................................ H03F 3/45
(52) U.S. Cl. ...................................... 330/254; 330/279
(58) Field of Search ................................. 330/127, 253, 330/254, 278, 279; 455/232.1

(56) References Cited

U.S. PATENT DOCUMENTS

| | | | |
|---|---|---|---|
| 4,227,256 A | 10/1980 | O'Keefe | 455/251 |
| 5,933,771 A * | 8/1999 | Tiller et al. | 330/254 |
| 5,999,056 A | 12/1999 | Fong | 330/278 |
| 6,046,640 A * | 4/2000 | Brunner | 330/254 |
| 6,172,566 B1 | 1/2001 | Nguyen | 330/254 |
| 6,181,206 B1 * | 1/2001 | Palmisano et al. | 330/278 |
| 6,404,283 B1 * | 6/2002 | Lau et al. | 330/129 |
| 6,472,936 B1 * | 10/2002 | Jones | 330/51 |
| 6,525,609 B1 * | 2/2003 | Behzad | 330/254 |
| 6,674,327 B2 * | 1/2004 | Harberts | 330/254 |

OTHER PUBLICATIONS

Arvin R. Shahani et al., "A 12–mW Wide Dynamic Range CMOS Front–End for a Portable GPS Receiver", IEEE Journal of Solid–State Circuits, vol. 32, No. 12, Dec. 1997, p. 2061–2070.

* cited by examiner

Primary Examiner—Khanh V. Nguyen
(74) Attorney, Agent, or Firm—Baker Botts L.L.P.

(57) ABSTRACT

A dual gain amplification low noise amplifier that includes an amplification circuit to a provide dual gain amplification—high gain amplification for a weak data signal and low gain amplification for a strong data signal. Also included is a control circuit to maintain approximately the same P1dB point for the weak signal during high gain amplification as for the strong signal during low gain amplification.

24 Claims, 5 Drawing Sheets

DUAL GAIN AMPLIFICATION LOW NOISE AMPLIFIER

RELATED APPLICATIONS

This application claims the benefit of Ser. No. 60/350,417, entitled "Dual Gain Amplification Low Noise Amplifier," filed provisionally on Jan. 18, 2002.

FIELD OF THE INVENTION

The present invention relates generally to the field of wireless communications systems and, more specifically, to low noise amplifiers for use in such systems.

BACKGROUND OF THE INVENTION

In modern communications, data signals are being transmitted through the air continuously. Those data signals are received at a variety of amplitudes. Consequently, receivers must be able to process data signals of varying received signal strength. Therefore, many modern hi-tech receivers contain amplifiers that produce variable gain amplification outputs. Such amplifiers are aptly called variable gain amplification amplifiers. A "dual gain amplification" amplifier is a specific kind of variable gain amplification amplifier that produces a high gain amplification output and a low gain amplification output. Amplifiers of this nature are usually included in a receiver to provide gain amplification to the data signal at the beginning (or front end) of the receive circuit. However, when the data signal is amplified, any noise introduced in the received signal will also be amplified and propagated through the receive chain circuitry. Consequently, amplifiers in the receiver are usually designed to provide very low noise and are often referred to as low-noise amplifiers, or LNAs.

Figure 1A:
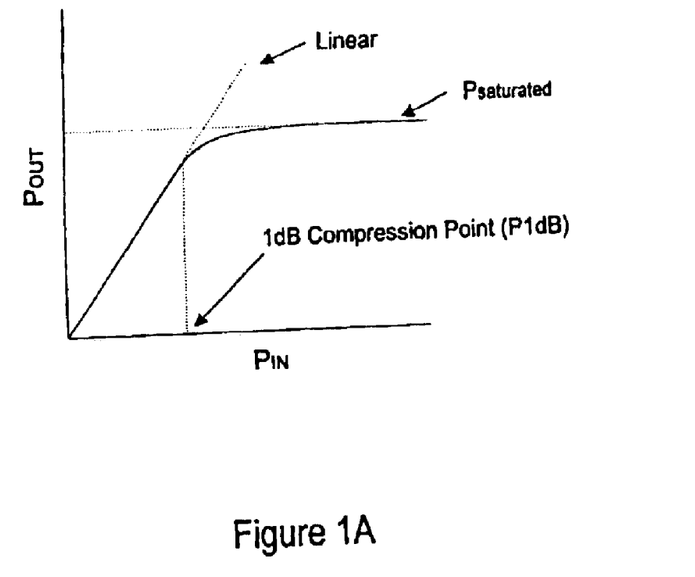
FIG. 1A is an illustration demonstrating the principle of 1 dB compression caused by an amplifier.

LNAs, like all other amplifiers, suffer from a phenomenon called signal compression. Signal compression is the phenomenon of limiting gain amplification. Because of the physical characteristics of transistors, or other elements in the LNA, a signal cannot be infinitely amplified. There is a point at which amplification begins to reach saturation. That point is referred to as the 1 dB compression point, or "P1dB". FIG. 1A is an illustration demonstrating the principle of 1 dB compression caused by an amplifier. Referring to FIG. 1A, signal compression can be seen when the gain amplification output of an amplifier (Pout) stops having a linear relation to the input signal (Pin), and begins to saturate. P1dB is the point at which Pout deviates from a linear increase with Pin, and begins to "compress" towards a saturation level (Psaturated).

Figure 1B:
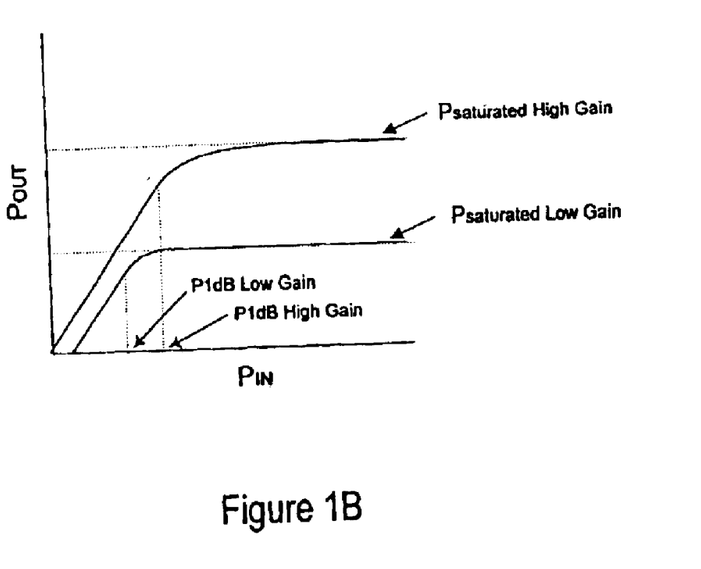
FIG. 1B is an illustration of two signals—one receiving a high gain amplification process and the other receiving a low gain amplification process, with corresponding P1dB, according to the prior art.

One particular problem, however, with modern dual-gain amplification amplifiers is that they produce a P1dB for low gain amplification that is much lower than the P1dB for high gain amplification. FIG. 1B is an illustration of two signals; one signal receiving a high gain amplification and the other signal receiving a low gain amplification, with corresponding P1dBs according to the prior art. Prior art dual-gain amplification LNAs produce results as shown in FIG. 1B wherein during low gain amplification, the data signal will begin to experience signal compression sooner than it would than during high gain amplification. It would be advantageous, however, to maintain the same high P1dB for low gain amplification as for high gain amplification.

Some prior art devices have attempted to stabilize P1dB for high and low gain amplification by utilizing an attenuation circuit (also called a mismatch circuit) in the receiver to attenuate the incoming data signal. However, a mismatch circuit introduces excessive noise, thus leading to a very noisy LNA.

Consequently, it would be advantageous to have a dual-gain amplification LNA that maintains the same P1dB for low gain amplification as for high gain amplification without introducing excessive mismatch circuit noise or without causing the P1dB for the overall circuit to suffer.

BRIEF DESCRIPTION OF THE DRAWINGS

The present invention is illustrated by way of example and should not limitation in the figures of the accompanying drawings in which like references indicate similar elements and in which.

SUMMARY OF THE INVENTION

A dual gain amplification low noise amplifier includes an amplification circuit to a provide dual gain amplification—high gain amplification for a weak data signal and low gain amplification for a strong data signal—and a control circuit to maintain approximately the same P1dB point for the weak signal during high gain amplification as for the strong signal during low gain amplification.

Other features of the present invention will be apparent from the accompanying drawings and from the detailed description that follows.

DETAILED DESCRIPTION OF THE INVENTION

Described herein is a novel dual gain amplification low noise amplifier. In the following description numerous specific details are set forth in order to provide a through understanding of the present invention. One of ordinary skill in the art, however, will appreciate that these specific details are not necessary to practice the present invention. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art upon review of this specification. For example PMOS transistors could be used in place of the NMOS transistors described below.

Figure 2:
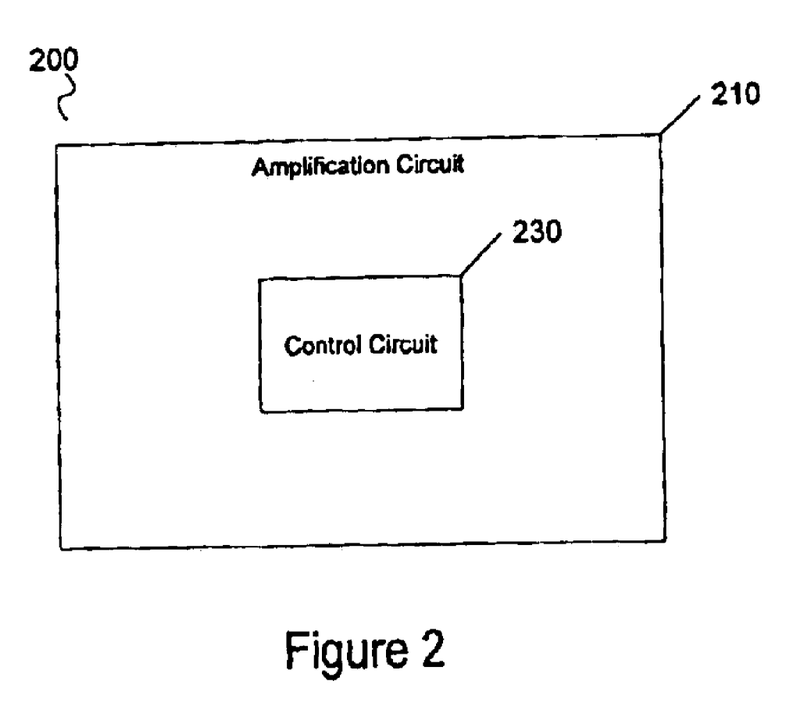
FIG. 2 is an illustration of one embodiment of an LNA according to the present invention.

FIG. 2 is a diagram of one embodiment of an LNA 200 according to the present invention. Referring to FIG. 2, LNA 200 includes an amplification circuit 210 and a control circuit 230. In one embodiment, the amplification circuit can provide two gain amplifications, high and low, for a weak and strong signal, respectively. The amplification circuit 210 will have a corresponding P1dB point for the low gain amplification process and the high gain amplification process. The control circuit 230 is configured to maintain approximately the same P1dB point for the weak signal during high gain amplification as for the strong signal during low gain amplification. In one embodiment, the control circuit does this by reducing current flow through the amplification circuit for low gain amplification, but not for high gain amplification.

Figure 3:
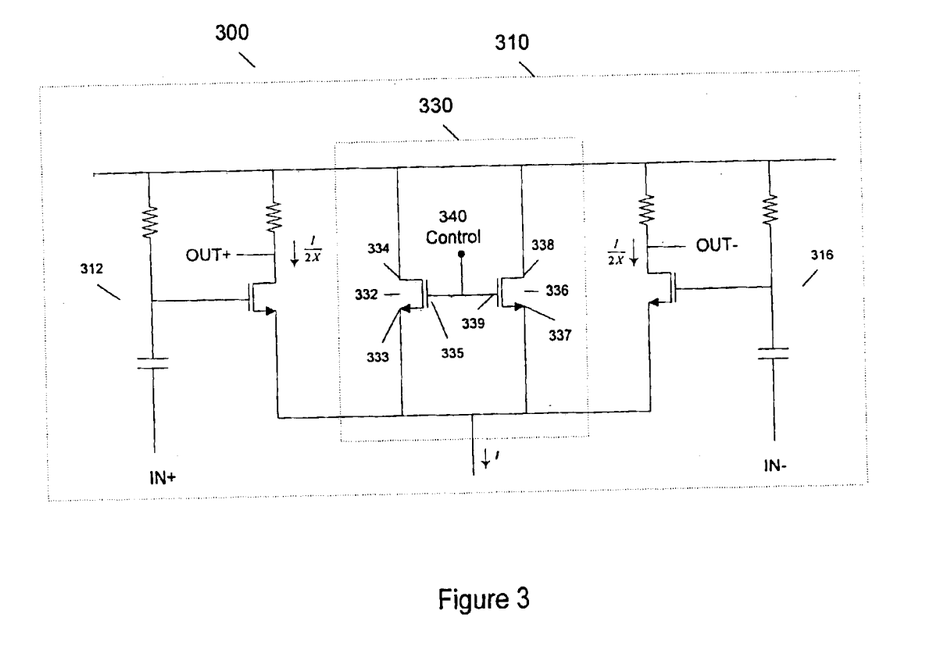
FIG. 3 is an illustration of another embodiment of an LNA according to the present invention.

FIG. 3 is an illustration of one embodiment of an LNA 300 configured according to the present invention. The LNA 300 includes an amplification circuit 310 and a control circuit 330. The amplification circuit 310 is a common source amplifier with two amplifier branches 312 and 316 connected in parallel to each other. The control circuit 330 is connected in parallel to the amplifier branches 312 and 316. The control circuit 330 is configured to draw current away from the amplifier branches for, or during, low gain amplification.

In one embodiment, the control circuit 330 includes a first NMOS transistor 332 with a source 333, drain 334, and a gate 335. The source 333 and drain 334 are connected in parallel to the first amplifier branch 312. The control circuit 330 also includes a second NMOS transistor 336 with a source 337, drain 338 and a gate 339. The source 337 and drain 338 are connected in parallel to the second amplifier branch 316. The gate 335 of the first NMOS transistor 332 and the gate 339 of the second CMOS transistor 336 are each connected to a common control node 340. The control node 340 is coupled to receive a control signal that will turn the control circuit on and off, or more specifically, to turn on the first and second NMOS transistors 332 and 336 during low gain amplification processes, thus allowing current to flow through these transistors, which in turn draws current away from the amplifier branches 312 and 316, during low gain amplification processes. When no control signal is applied to node 340, the control circuit 330 will act as an open circuit and a current I will flow through each amplifier branch 312 and 316 at ½ I. However, when the control circuit 330 is on, the control circuit 330 will draw current through the control circuit, thus causing less current flow to the amplifier branches 312 and 316. Current flow through each amplifier branch then will be (1/2x)I, where x depends on the size and quality of the transistors 332 and 336.

An advantage of reducing current flow through the amplifier branches 312 and 316 during low gain amplification processes, is that the P1dB point for low gain amplification processes improves to a point approximating the P1dB for high gain amplification processes. Therefore, embodiments of the present invention provide a means for maintaining an approximately constant P1dB point for a weak signal during high gain amplification as for a strong signal during low gain amplification.

Another advantage of reducing current flow through the amplifier branches 312 and 316 is the considerable reduction in the amount of noise produced by the LNA 300 during low gain amplification. More specifically, the noise of the LNA 300 is proportional to the noise produced in the common source amplifier circuit 310, or in equation form, N(lna)∝N (common-gate-amplifier). Consequently, during low gain amplification, considerably less current is flowing through the amplifier branches 312 and 316 of the common source amplifier circuit 310. With less current flowing through the circuit, less power-source noise is produced, leading to less overall noise produced by the LNA 300 in general. Therefore, the present invention provides a means for reducing noise in an LNA during low gain amplification.

Yet another advantage of reducing current flow through the amplifier branches 312 and 316, during low gain amplification, is the amount of power needed to operate the LNA 300. With less current needed, less power is consumed. Therefore, embodiments of the present invention provide a means for reducing power consumption in an LNA during low gain amplification.

Figure 4:
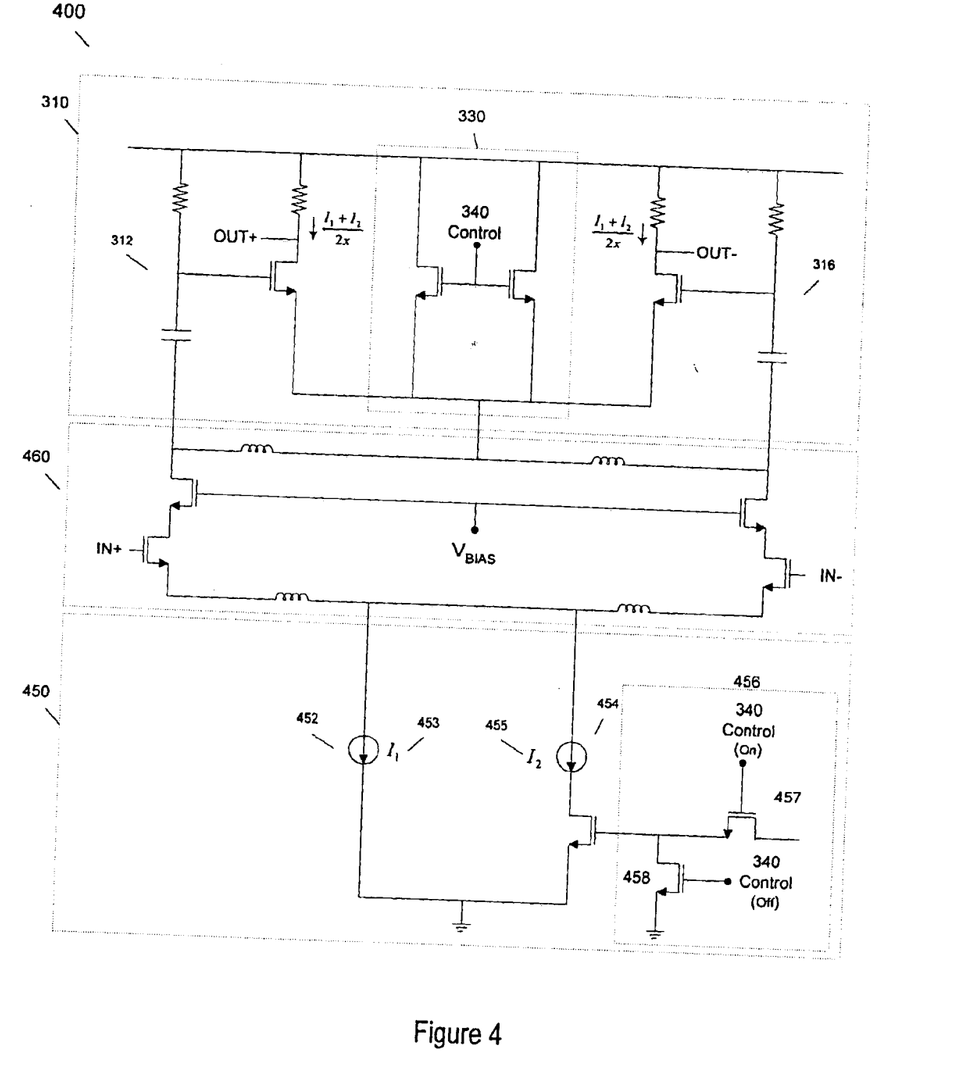
FIG. 4 is an illustration of yet another embodiment of a LNA according to the present invention.

FIG. 4 is an illustration of one embodiment of an LNA 400 according to the present invention. LNA 400 includes an amplifier circuit 310, a control circuit 330, and a current source circuit 450. The current source circuit 450 includes a first current source 452 to provide a first current ("I1") 453. In the LNA 400, when the first current source 452 is on, it causes I1 to flow through the amplifier circuit 310, thus resulting in a first gain amplification G1 being produced by the LNA 400. LNA 400 also includes a second current source 454 to provide a second current ("I2"). In the LNA 400, when the second current source 454 is on, it causes I2 to flow through the amplifier circuit 310, thus resulting in a second gain amplification, G2, being produced by the LNA 400. G1 may also be referred to herein as "low gain amplification" or "Glow" while G2 may also be referred to herein as "high gain amplification" or "Ghigh".

In one embodiment, both current sources 452 and 454 could be switchable. In another embodiment, however, only one of the current sources 452 and 454 needs to be switchable. For instance, referring to FIG. 4, in one embodiment, the first current source 452 may be continuously on, thus causing I1/2 to run through amplifier branches 312 and 316, producing a constant low gain amplification G1. The second current source 454, however, is not continuously on, but is switchable. Therefore, the second current source 454 is used to provide a switchable current signal, I2, which is to be added to I1, thus causing current (I1+I2)/2x to flow through the amplifier circuit 310 and resulting in a high gain amplification, G2, which is greater than G1. Thus, in one embodiment, LNA 400 may further include a switch circuit 456 (e.g. as shown in the figure using a pass gate 457 and/or a shunt 458) connected in series with the second current source, said switch circuit to switch the second current source on during high gain operation and off during low gain operation. In one embodiment, the control circuit 330 and the switch circuit 456 can be switched on and off by the same control signal 340.

LNA 400 may further include a common source amplifier circuit 460 connecting the common source amplifier circuit 310 and the current source circuit 450. This results in a two-stage amplifier, the common source amplifier circuit 460 being the first stage and common source amplifier circuit 310 being the second stage.

Figure 5:
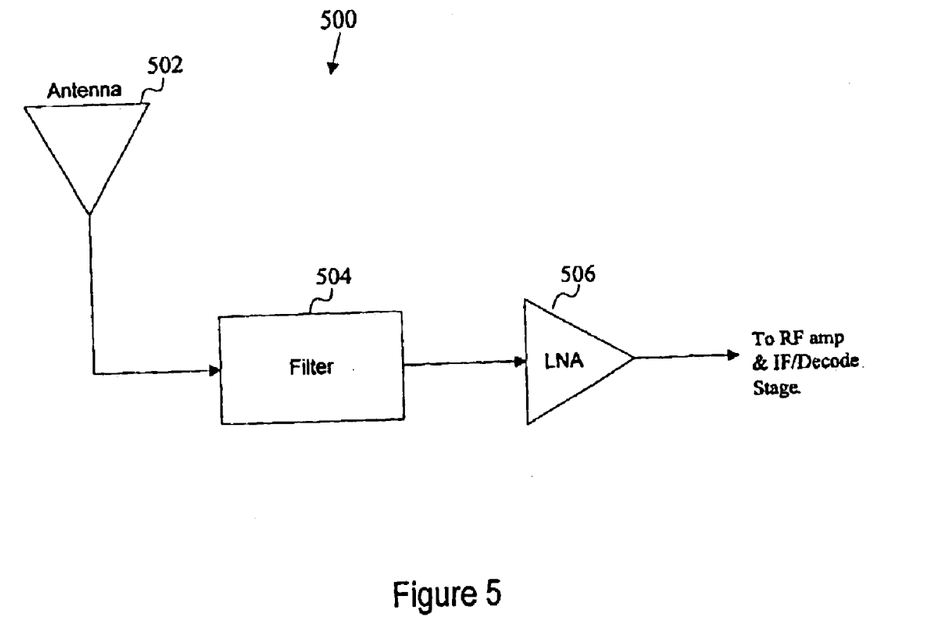
FIG. 5 is a block diagram of a receiver incorporating an LNA configured according to the present invention.

FIG. 5 is a block diagram of a front end of a receiver 500 configured according to the present invention. Receiver 500 includes an antenna 502, a filter 504, and an LNA 506. Further elements of receiver 500 are not shown and may consist of conventional RF/IF/baseband processing stages. The antenna can be of any type known in the art. Particularly, the antenna should be able to receive data signals of varying strengths and frequencies. In one embodiment, receiver 500 may include more than one antenna. Filter 504 may be a band-pass, bandstop, high-pass, low-pass, long-pass, radio-frequency, or any other type of filter known in the art. The filter 504 is to filter data signals of varying strengths and frequencies. LNA 506 is configured in accordance with the present invention to provide high gain amplification to a weak data signal and low gain amplification to a strong data signal. In one embodiment, LNA 506 includes an amplification circuit and a control circuit coupled to reduce current flow to the amplification circuit during low gain amplification. As the LNA 506 provides low gain amplification and high gain amplification, received data signals will begin to saturate at corresponding P1dB points. The LNA 506 is configured to maintain approximately the same P1dB for high gain amplification as for low gain amplification. LNA 506 may be any one of the embodiments for an LNA described in conjunction with FIGS. 2, 3, and 4 above.

What is claimed:

1. A low noise amplifier, comprising:
    an amplification circuit configured to provide high gain amplification to a weak signal having a first corresponding 1 dB compression point ("P1dB"), and a low gain amplification to a strong signal having a second corresponding P1dB; and
    a control circuit coupled to the amplification circuit and configured to cause the amplification circuit to maintain approximately the same P1dB points for the weak signal during high gain amplification as for the strong signal during low gain amplification.

2. The low noise amplifier of claim 1, wherein said control circuit is coupled to reduce current, flow through the amplification circuit during low gain amplification.

3. The low noise amplifier of claim 1, wherein said amplification circuit comprises:
    a first common source amplifier circuit comprising first and second amplifier branches connected in parallel to each other, and said control circuit is connected in parallel to the first and second amplifier branches.

4. The low noise amplifier of claim 3, wherein said control circuit comprises:
    a first transistor comprising a first source, first drain, and a first gate, said first source and first drain connected in parallel to the first amplifier branch; and
    a second transistor comprising a second source, second drain, and a second gate, said second source and second drain connected in parallel to the second amplifier branch, said first and second gates of the first and second transistors each connected to a common control node.

5. The low noise amplifier of claim 1, further comprising a current source circuit, said current source circuit comprising:
    a first current source coupled to provide a constant current signal to said amplification circuit for a low gain amplification;
    a second current source coupled in parallel to the first current source and configured to provide a switchable current signal to be added to the constant current signal during high gain amplification; and
    a switching circuit coupled to the second current source and configured to switch the second current source on or off according to a control signal.

6. The low noise amplifier of claim 5, further comprising:
    a second common source amplifier circuit coupled to the first common source amplifier circuit and the current source circuit.

7. A dual gain amplifier, comprising:
    a first common source amplifier circuit comprising first and second amplifier branches connected in parallel to each other; and
    a control circuit connected in parallel to the first and second amplifier branches and configured to draw current away from the first and second amplifier branches during low gain amplification, wherein the control circuit comprises:
        a first transistor comprising a first source, first drain, and a first gate, said first source and first drain coupled in parallel to the first amplifier branch; and
        a second transistor comprising a second source, second drain, and a second gate, said second source and second drain coupled in parallel to the second amplifier branch, and said first and second gates of the first and second transistors coupled to a control node to receive a control signal.

8. The dual gain amplifier of claim 7, further comprising a current source circuit coupled to the amplifier circuit.

9. The dual gain amplifier of claim 8, wherein said current source circuit comprises:
    a first current source coupled to provide a first current signal to the amplifier circuit during low gain amplification; and
    a second current source coupled in parallel with the first current source, to provide a second current signal to the amplifier circuit during high gain amplification.

10. The dual gain amplifier of claim 9, wherein said first current source is continuously on to provide a constant low gain amplification, and said second current source is switchable to provide additional current to the amplifier circuit, thus resulting in a high gain amplification.

11. The dual gain amplifier of claim 10, further comprising:
    a switching circuit coupled to the second current source, said switching circuit configured to switch the second current source on and off according to a control signal.

12. The dual gain amplifier of claim 8, further comprising:
    a second common source amplifier circuit coupled between the first common source amplifier circuit and the current source circuit.

13. A low noise amplifier, comprising:
    an amplification circuit configured to provide high gain amplification to a weak signal associated with a first corresponding P1dB, and low gain amplification to a strong signal having associated with a second corresponding P1dB; and
    means for reducing current flow through the amplification circuit during low gain amplification to cause the amplification circuit to maintain approximately the same P1dB points for the weak signal during high gain amplification as for the strong signal during low gain amplification.

14. A receiver comprising:
    an antenna to capture at least one of a weak signal and a strong signal;
    a filter, coupled to the antenna to filter the at least one of a weak signal and a strong signal; and
    a low noise amplifier (LNA) coupled to the filter to receive the at least one of a weak signal and a strong signal, the LNA comprising an amplifier circuit configured to provide high gain amplification to the weak signal and to provide low gain amplification to the strong signal, and a control circuit coupled to reduce current flow to the amplifier circuit for low gain amplification, wherein the control circuit is configured to maintain approximately the same P1dB point for the strong signal during low gain amplification as for the weak signal during high gain amplification.

15. The receiver of claim 14, wherein said amplifier circuit comprises first and second amplifier branches coupled in parallel to each other, and said control circuit is coupled in parallel to the first and second amplifier branches.

16. The receiver of claim 15, wherein said control circuit comprises:
    a first transistor comprising a first source, first drain, and a first gate, said first source and first drain connected in parallel to the first amplifier branch; and
    a second transistor comprising a second source, second drain, and a second gate, said second source and second drain connected in parallel to the second amplifier branch, said first and second gates of the first and second transistors each connected to a common control node.

17. The receiver of claim 14, wherein the LNA further comprises a current source circuit, said current source circuit comprising:
   a first current source coupled to provide a constant current signal to said amplification circuit for a low gain amplification;
   a second current source coupled in parallel to the first current source and configured to provide a switchable current signal to be added to the constant current signal during high gain amplification; and
   a switching circuit coupled to the second current source and configured to switch the second current source on or off according to a control signal.

18. A low noise amplifier, comprising:
   an amplification circuit configured to provide high gain amplification to a weak signal associated with a first corresponding 1 dB compression point ("P1dB"), and a low gain amplification to a strong signal associated with a second corresponding P1dB, wherein the amplification circuit comprises a first common source amplifier circuit comprising first and second amplifier branches connected in parallel to each other; and
   a control circuit coupled to the amplification circuit and configured to cause the amplification circuit to maintain approximately the same P1dB points for the weak signal during high gain amplification as for the strong signal during low gain amplification, wherein the control circuit is connected in parallel to the first and second amplifier branches and comprises:
      a first transistor comprising a first source, first drain, and a first gate, said first source and first drain connected in parallel to the first amplifier branch; and
      a second transistor comprising a second source, second drain, and a second gate, said second source and second drain connected in parallel to the second amplifier branch, said first and second gates of the first and second transistors each connected to a common control node.

19. A low noise amplifier, comprising:
   an amplification circuit configured to provide high gain amplification to a weak signal associated with a first corresponding 1 dB compression point ("P1dB"), and a low gain amplification to a strong signal associated with a second corresponding P1dB;
   a control circuit coupled to the amplification circuit and configured to cause the amplification circuit to maintain approximately the same P1dB points for the weak signal during high gain amplification as for the strong signal during low gain amplification; and
   a current source circuit, comprising:
      a first current source coupled to provide a constant current signal to said amplification circuit for a low gain amplification;
      a second current source coupled in parallel to the first current source and configured to provide a switchable current signal to be added to the constant current signal during high gain amplification; and
      a switching circuit coupled to the second current source and configured to switch the second current source on or off according to a control signal.

20. A dual gain amplifier, comprising:
   a first common source amplifier circuit comprising first and second amplifier branches connected in parallel to each other;
   a control circuit connected in parallel to the first and second amplifier branches and configured to draw current away from the first and second amplifier branches during low gain amplification; and
   a current source circuit coupled to the amplifier circuit, comprising:
      a first current source coupled to provide a first current signal to the amplifier circuit during low gain amplification; and
      a second current source coupled in parallel with the first current source, to provide a second current signal to the amplifier circuit during high gain amplification.

21. A dual gain amplifier, comprising:
   a first common source amplifier circuit comprising first and second amplifier branches connected in parallel to each other;
   a control circuit connected in parallel to the first and second amplifier branches and configured to draw current away from the first and second amplifier branches during low gain amplification;
   a current source circuit coupled to the first common source amplifier circuit; and
   a second common source amplifier circuit coupled between the first common source amplifier circuit and the current source circuit.

22. A receiver comprising:
   an antenna to capture at least one of a weak signal and a strong signal; a filter, coupled to the antenna to filter the at least one of a weak signal and a strong signal; and
   a low noise amplifier (LNA) coupled to the filter to receive the at least one of a weak signal and a strong signal, the LNA comprising an amplifier circuit configured to provide high gain amplification to the weak signal and to provide low gain amplification to the strong signal, and a control circuit coupled to reduce current flow to the amplifier circuit for low gain amplification;
   wherein said control circuit comprises:
      a first transistor comprising a first source, first drain, and a first gate, said first source and first drain connected in parallel to the first amplifier branch; and
      a second transistor comprising a second source, second drain, and a second gate, said second source and second drain connected in parallel to the second amplifier branch, said first and second gates of the first and second transistors each connected to a common control node.

23. A receiver comprising:
   an antenna to capture at least one of a weak signal and a strong signal;
   a filter, coupled to the antenna to filter the at least one of a weak signal and a strong signal;
   a low noise amplifier (LNA) coupled to the filter to receive the at least one of a weak signal and a strong signal, the LNA comprising an amplifier circuit configured to provide high gain amplification to the weak signal and to provide low gain amplification to the strong signal, and a control circuit coupled to reduce current flow to the amplifier circuit for low gain amplification; and
   a current source circuit, comprising:
      a first current source coupled to provide a constant current signal to said amplification circuit for a low gain amplification;
      a second current source coupled in parallel to the first current source and configured to provide a switchable current signal to be added to the constant current signal during high gain amplification; and a switching circuit coupled to the second current source and configured to switch the second current source on or off according to a control signal.

24. A method for performing amplification, comprising:

providing high gain amplification to a weak signal associated with a first corresponding 1 dB compression point ("P1dB");

providing low gain amplification to a strong signal associated with a second corresponding P1dB; and maintaining approximately the same P1dB points for the weak signal during high gain amplification as for the strong signal during low gain amplification.

* * * * *